United States Patent [19]

Shimanek

[11] Patent Number: 5,694,055

[45] Date of Patent: Dec. 2, 1997

[54] ZERO STATIC POWER PROGRAMMABLE LOGIC CELL

[75] Inventor: Schuyler E. Shimanek, Albuquerque, N. Mex.

[73] Assignee: Philips Electronic North America Corp., New York, N.Y.

[21] Appl. No.: 607,405

[22] Filed: Feb. 27, 1996

[51] Int. Cl.$^6$ ............................................. H03K 19/0185
[52] U.S. Cl. ............................................. 326/37; 326/121
[58] Field of Search ............................... 326/21, 37–38, 326/86, 121

[56] References Cited

U.S. PATENT DOCUMENTS 4,858,185  8/1989  Kowshik et al. ............... 365/185.1 X
5,134,311  7/1992  Biber et al. ....................... 326/30 X
5,144,582  9/1992  Steele .
5,491,431  2/1996  Nasserbakht ....................... 326/38

*Primary Examiner*—David R. Hudspeth
*Attorney, Agent, or Firm*—Brian J Wieghaus

[57]  ABSTRACT

A zero static power programmable logic cell that operates without $I_{cc}$ leakage in the circuit being driven when the control nodes are set to $V_{cc}$ or ground, and has a decreased switching skew is provided. The logic cell utilizes stacked transistors and separates the output node from the input nodes by forming an inverter stage based on the current state of operation. The inverter stage isolates the output node from the input nodes, while also providing gain to the next stage. This configuration provides for a more compact cell design and prevents $I_{cc}$ leakage in the circuitry being driven by the logic cell.

1 Claim, 2 Drawing Sheets

ZERO STATIC POWER PROGRAMMABLE LOGIC CELL

BACKGROUND OF THE INVENTION

1. Field of the Invention

The present invention relates to logic cells. More particularly, it relates to a zero static power programmable logic cell.

2. The Prior Art

There are several prior art logic cell devices that take many forms. These logic cell devices form the core of programmable logic devices, for example, PLDs, CPLDs, and provide the logic input signals for the CMOS functional blocks, for example, flip-flops, which follow. The logic cell device must be chosen so as to prevent, or minimize leakage in the circuitry being driven by the logic cell device.

One commonly used design is the NMOS pass-gate design. To minimize $I_{cc}$ leakage in the CMOS circuitry being driven, the pass-gate design requires a control gate voltage that is at least one threshold above $V_{cc}$ to ensure its ouput is driven to $V_{cc}$. In addition, with the pass-gate configuration, the switching skew (i.e., HL vs, LH) tends to be higher than would be desirable.

The control voltage requirement of the pass-gate design can be overcome by using a full-pass gate design (NMOS and PMOS) or by designing the NMOS pass-gates as EEPROM elements. These solutions have their own problems.

The full-pass gate design requires additional circuitry (6 transistors) in order to prevent $I_{cc}$ leakage in the next circuit stage.

Using an NMOS EEPROM pass-gate cell requires that the floating gate voltage be programmed, and remain at least one threshold voltage above $V_{cc}$ to prevent $I_{cc}$ leakage in the next stage of the circuit. Again, larger transistors will be required in order to obtain the same propagation delay. The large differential in required threshold voltage between programmed and erased states make this approach problematic.

SUMMARY OF THE INVENTION

The present invention provides a zero static power circuit that operates without $I_{cc}$ leakage in the following stage when the control nodes are set to $V_{cc}$ or ground, and has a decreased switching skew resulting in decreased propagation delay through the logic cell.

According to the invention, a zero static power programmable logic cell includes a plurality of transistors coupled together to receive data and control information from separate data and control inputs. Based on the inputs, an inverter stage is formed from at least two of the plurality of transistors. When the inverter stage is formed, the output is driven to either a full zero (ground) or a full one ($V_{cc}$), thus preventing any $I_{cc}$ leakage from occurring in the circuits being driven by the programmable cell.

The transistors used by the invention are preferably CMOS devices, and are connected in a stacked series configuration. This connection configuration enables the use of eight transistors in the physical space of four, and further provides a decreased switching skew which results in decreased propagation delay through the logic cell.

It is therefore an object of the present invention to provide a zero static power logic cell that is programmable.

It is a further object of the invention to provide a zero static power programmable logic cell that operates without $I_{cc}$ leakage in the driven circuitry when the control nodes are set to $V_{cc}$ or ground.

It is another object of the invention to provide a zero static power programmable logic cell that has a decreased switching skew.

Yet another object of the invention is to provide a zero static power programmable logic cell that has a decreased propagation delay through the cell.

Another object of the invention is to provide a zero static power programmable logic cell that operates efficiently and reliably.

BRIEF DESCRIPTION OF THE DRAWINGS

Other objects and features of the present invention will become apparent from the following detailed description considered in connection with the accompanying drawings which disclose an embodiment of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
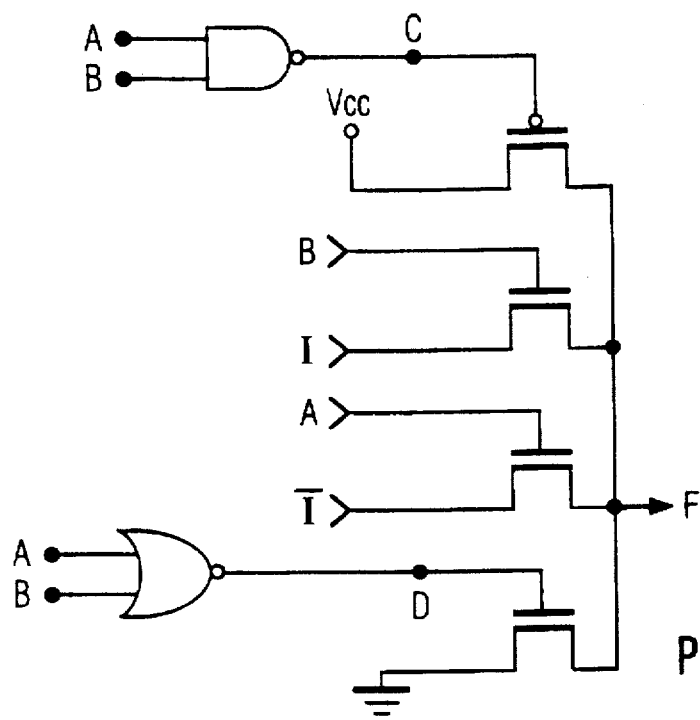
FIG. 1 is a schematic diagram of a conventional logic NMOS pass-gate of the prior art.

FIG. 1 shows a schematic of an existing pass-gate transistor design for providing output logic levels to a basic array element found in programmable logic devices (PLDs). This design adheres to the standard input conditions expressed by:

$$\overline{A}B + \overline{A}I + \overline{B}\overline{I} = F \tag{1}$$

where A and B are control signals provided by two independent memory elements, I and $\overline{I}$ are the respective true and complement components of the data path signal, and F is the resultant output signal.

The basic logic function being defined as:

| A | B | F |
|---|---|---|
| 0 | 0 | 0 |
| 0 | 1 | I |
| 1 | 0 | $\overline{I}$ |
| 1 | 1 | 1 |

The pass-gate of FIG. 1 requires 12 transistors to provide the requisite output signal. In order to operate properly, the gates of A and B must be pulled to a voltage at least one threshold above $V_{cc}$ in order to prevent $I_{cc}$ leakage in the next gate when passing a '1' level. This requires a charge pump that periodically uses power to sustain this 'super voltage', or an EE cell that reliably produces a floating gate voltage at least one threshold above $V_{cc}$.

If however, a charge pump or other means for producing the 'super voltage' is not desired, full pass-gates can be used in A and B, and a P-channel and N-channel device on C and D, respectively. (FIG. 2) This solution would not require a 'super voltage', but does increase the cell's gate count. Thus, in order to produce the requisite output signals to the PLD, additional circuitry must be added to the circuit of FIG. 1, thereby increasing the size of the circuit.

Figure 2:
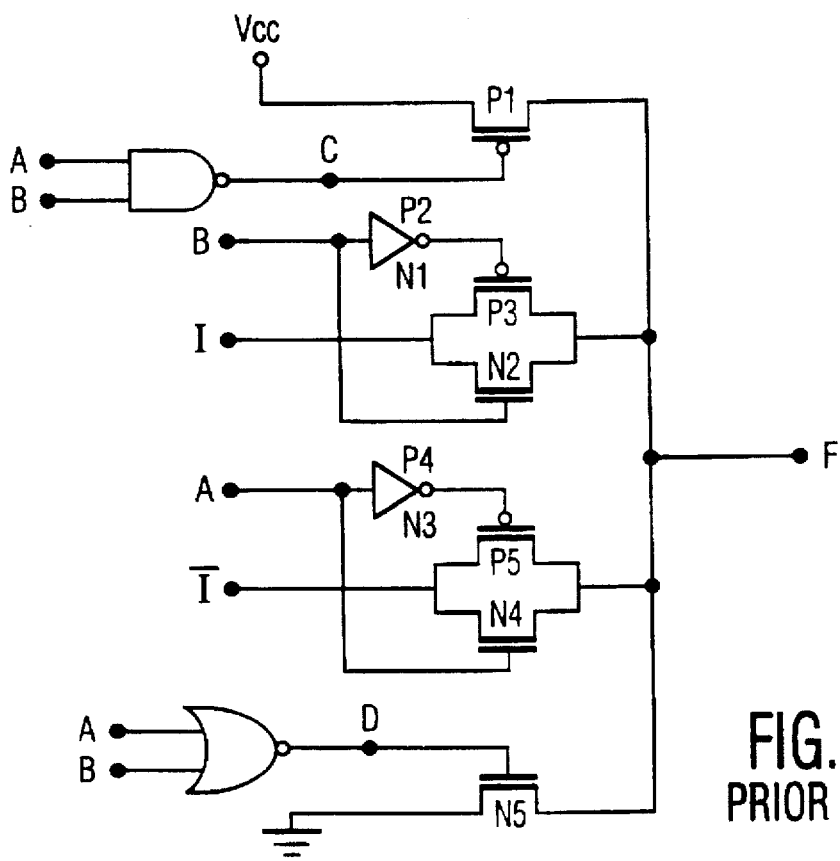
FIG. 2 is a schematic diagram of a logic full pass-gate of the prior art.

FIG. 2 shows an 18 transistor full pass-gate solution to eliminate the $I_{cc}$ leakage problems addressed by the present invention. (NAND and NOR gates of FIG. 1 must still provide signals C & D in FIG. 2) When the input node is driven to either $V_{cc}$ or ground, the output node F is driven to wither $V_{cc}$ or ground, and any $I_{cc}$ leakage in the next gate is eliminated.

Figure 3:
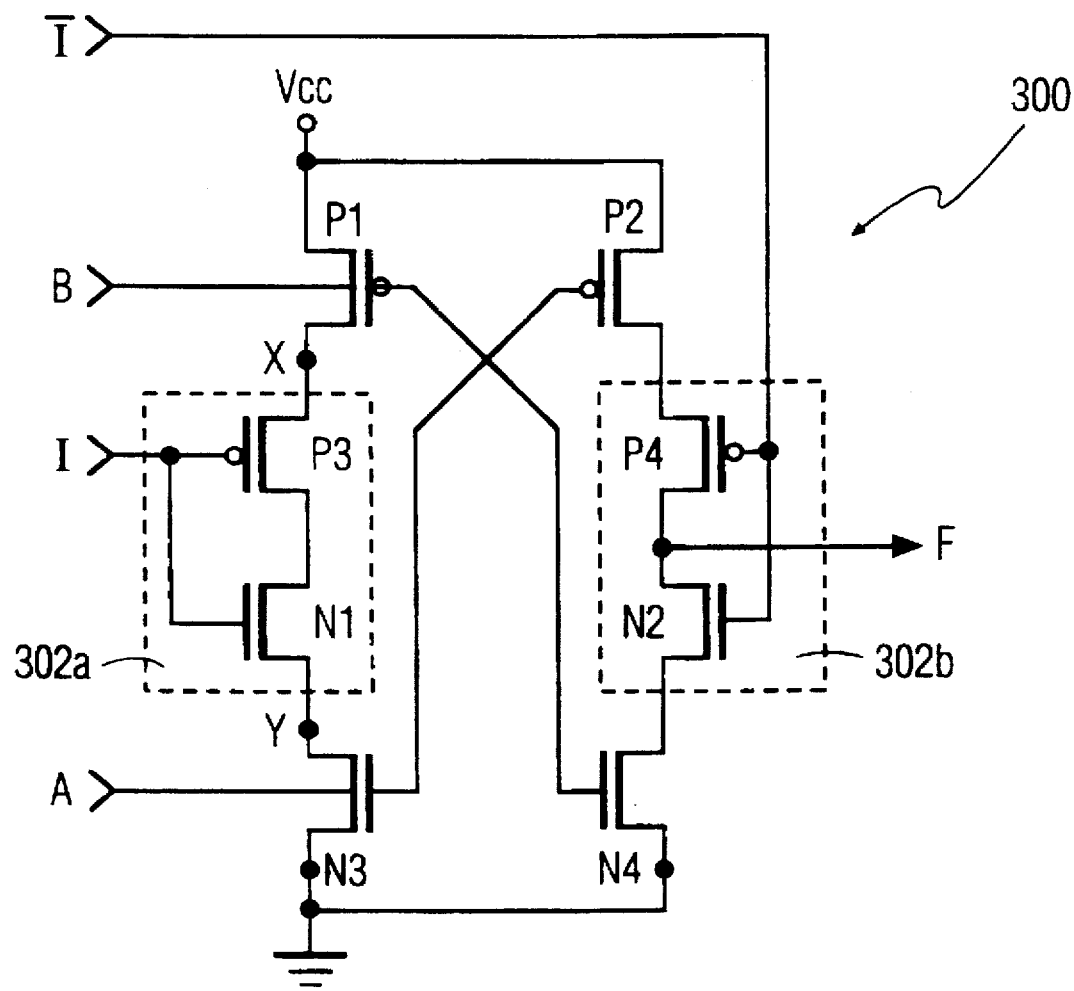
FIG. 3 is a schematic diagram of the improved logic cell according to the invention.

FIG. 3 shows an improved zero static power logic cell according to the invention. This circuit is functionally identical to the prior art circuit of FIG. 2, however it provides several advantages over the prior art.

Transistors P1, P2, N3 and N4 operate statically, and their effective channel resistance is reduced during the switching of P3/N1 or P4/N2 because of their capacitive coupling to their supply. Thus, for a given channel size, the cell has a higher maximum frequency (fmax) than the pass-gate solution.

This cell provides the standard output logic levels of a basic array element found in PLDs, CPLDs, FPGAs, etc. Circuit 300 uses 8 transistors P1–P4 and N1–N4, but can be produced in the space of 4 transistors because the gates of said transistors are stacked and connected in series. Thus, the physical cell size of circuit 300 is significantly less than half the cell size of the circuit of FIG. 2. Inputs A and B are two independent control signals that require only standard supply voltages to operate without leakage.

Regardless of the state of operation of circuit 300, the output at node F is always separated from the data input nodes I and Ī by an inverter stage 302a or 302b. The inverter stage not only provides gain to the next stage, but essentially isolates the output from the input. In the prior art of FIG. 2, the output capacitance, including the load presented by the following circuitry, is coupled to the input through the series resistance of the pass-gate. Since the construction of programmable logic is array-like, there are many of these programmable pass-gates, typically 100–150, connected in parallel to the input line. The output capacitance is therefore multiplied by this same factor, greatly loading the buffer which drives the input line to the programmable gate. In this invention, the load on the input line presented by each programmable gate is simply the gate capacitances of two transistors (either N1/P3 or N2/P4).

Stacked gates typically propagate a signal slower than non-stacked gates. However, in switching applications, the inside gate switches nearly as fast as non-stacked gates. To illustrate this point, refer to circuit 300, and assume node A is high and node B is low. Under these conditions, transistors P1 and N3 are active, while transistors P2 and N4 are not. Thus, inverter stage 302a, formed by P3 and N1 with data input I, makes the output node F dependent only upon node I. When node I is low, nodes X and F are high while node Y is low. As node I transitions from a low to a high, the parasitic capacitance at node Y (due to transistor parasitics) keeps node Y low while it charges. This temporarily 'short circuits' transistor N3 making the circuit perform as if it were a non-stacked gate. This same phenomenon occurs on the high to low transition, except the nodal capacitance of node X tends to keep it high by temporarily 'short circuiting' transistor P1.

During operation of inverter stage 302a, as I approaches $V_{cc}$, output node F approaches zero. Near the input threshold region, the negative voltage gain of the CMOS inverter, approximately −10, causes the output to move approximately one volt for a 100 mv change in input voltage. Thus, the output node F rapidly moves towards zero as the input voltage transitions through the threshold region, thus minimizing the effect of the slew rate at the input node on propagation delay.

The same conditions apply when control input A is low and B is high. That is, P2 and N4 are active, while P1 and N3 are not. In this mode, output F is coupled to the active input node Ī through inverter stage 302b, and inverter 302a is disabled.

The maximum frequency (fmax) at which circuit 300 operates is dependent upon the propagation delay and the skew, and can be calculated from the inverted sum of both the HL and LH propagations. Thus, the design of the cell attempts to minimize the HL and LH propagation delay, and even make them equal.

While one embodiment of the present invention has been shown and described, it is to be understood that many changes and modifications may be made thereunto without departing from the spirit and scope of the invention as defined in the appended claims.

What is claimed is:

1. A zero static power programmable logic cell for providing logic signals to logic gate devices, said logic cell comprising:

at least two control inputs, at least two data inputs and an output;

first and second circuit branches, each branch being connected between first and second circuit potentials, each branch including in series a first, p-channel MOS transistor, a second, p-channel MOS transistor, a third, n-channel MOS transistor and a fourth n-channel MOS transistor;

said first, p-channel transistor of said first branch and said fourth, n-channel transistor of said second branch each including a control gate connected to one of said at least two control inputs, said fourth, n-channel transistor of said first branch and said first, p-channel transistor of said second branch each including a control gate connected to the other of said at least two control inputs, said second, p-channel MOS transistor and said third, n-channel transistor of said first and branch having control gates connected to each other for forming a first inverter, the first inverter being coupled to one of said at least two data inputs, said second, p-channel MOS transistor and said third, n-channel transistor of said second branch having control gates connected to each other for forming a second inverter, the first inverter being coupled to the other of said at least two data inputs, a node between the second, p-channel MOS transistor and said third, n-channel transistor of said second branch being connected to (I) said logic cell output and (ii) to a node between the second, p-channel MOS transistor and said third, n-channel transistor of said first branch said first and second inverters isolating said logic cell output from said logic cell inputs so that there is no current leakage into a circuit driven by said logic cell output when said control inputs are set to either of said first and second circuit potentials, and the MOS transistors of said first and second branches being arranged in a stacked configuration with the gates of the first branch stacked with corresponding gates of the second branch.

* * * * *